(12) United States Patent
Fifield et al.

(10) Patent No.: US 6,621,324 B2
(45) Date of Patent: Sep. 16, 2003

(54) REDUNDANT ANTIFUSE SEGMENTS FOR IMPROVED PROGRAMMING EFFICIENCY

(75) Inventors: John A. Fifield, Underhill, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/683,808

(22) Filed: Feb. 19, 2002

(65) Prior Publication Data

US 2003/0155961 A1 Aug. 21, 2003

(51) Int. Cl.[7] .............................................. H01H 37/76
(52) U.S. Cl. ....................................... 327/525; 327/526
(58) Field of Search .................................. 327/525, 526

(56) References Cited

U.S. PATENT DOCUMENTS

| | | | |
|---|---|---|---|
| 5,243,226 A | | 9/1993 | Chan |
| 5,294,846 A | | 3/1994 | Paivinen |
| 5,498,978 A | * | 3/1996 | Takahashi et al. ............ 326/38 |
| 5,517,455 A | * | 5/1996 | McClure et al. ......... 365/225.7 |
| 5,572,476 A | | 11/1996 | Eltoukhy |
| 5,789,970 A | * | 8/1998 | Denham ...................... 327/525 |
| 5,925,920 A | | 7/1999 | MacArthur et al. |
| 6,359,428 B1 | * | 3/2002 | Kawamura ................... 323/369 |
| 6,377,111 B1 | * | 4/2002 | Moreaux ..................... 327/525 |

* cited by examiner

Primary Examiner—Terry D. Cunningham
(74) Attorney, Agent, or Firm—McGuireWoods LLP; Mark Chadurjian

(57) ABSTRACT

An antifuse structure for improved programming efficiency is disclosed wherein the antifuse structure including a first node providing a first voltage, a plurality of antifuse elements, and a plurality of first switches. The plurality of antifuse elements are commonly connected to the first node. The plurality of first switches are sequentially activated during a program mode to individually apply the first voltage to each antifuse element. The antifuse structure may include a second node to which a second voltage is provided. Each of the plurality of first switches may be coupled between the second node and a corresponding one of the plurality of antifuse elements. The antifuse structure may also include a third node to which a fuse latch is connected. A plurality of second switches may be coupled between the third node and a corresponding one of the plurality antifuse elements. The plurality of second switches may be simultaneously activated during a read mode.

17 Claims, 3 Drawing Sheets

REDUNDANT ANTIFUSE SEGMENTS FOR IMPROVED PROGRAMMING EFFICIENCY

BACKGROUND OF THE INVENTION

Field of the Invention

The present invention generally relates to electric antifuses and, more particularly, to individually programming antifuse elements to prevent inconsistent programming resistance.

Antifuse structures and associated circuitry suitable for use in integrated circuits are generally incorporated in nonvolatile memory devices or used for electrically programmable repair techniques for a dynamic random access memory (DRAM) using a redundant memory capacity. Specifically, through the addition of special test modes, it is possible to implement the device's functionality without any alteration of the existing product pin-out specifications.

A basic antifuse element is generally a resistive fuse component, which has a very high resistance (e.g., >100M ohm) in its initial unprogrammed state and, after an appropriate programming operation, will have a significantly lower resistance (e.g., <10 K ohm). The antifuse element is typically composed of a very thin dielectric material such as silicon dioxide, silicon nitride, tantalum oxide or a sandwich combination of dielectrics such as an ONO (silicon dioxide-silicon nitride-silicon dioxide) structure between two conductors. The antifuse is programmed by applying an appropriate programming voltage under sufficient current flow through terminals of the antifuse for a sufficient time to cause the resistance of the antifuse to permanently change from high to low.

FIG. 1 depicts conventional singular antifuse structure 14 which is constructed with the individual fingers (antifuse elements) 14A, 14B, 14C and 14D connected in parallel to a high voltage programming source HV. The fingered antifuse elements are formed on a substrate 10, and contacts 12 are placed in the substrate 10 between the antifuse elements 14A, 14B, 14C and 14D. FIG. 1 shows a single programming filament 16 formed near the edge of the antifuse element 14C.

In this parallel antifuse programming scheme, the individual fingers 14A, 14B, 14C and 14D are very often programmed with very high programmed resistance values. Under identical conditions, one antifuse element may have a post-programming resistance of 100 k Ohms (or greater) and an adjacent element may have a post-programming resistance of 50 k Ohms (or less). This depends partially on the defect density in the antifuse elements.

Such inconsistent programming resistances makes it difficult to set an effective fuse latch trip point, to distinguish a programmed fuse from an unprogrammed fuse. If an effective fuse latch trip point is set too high, the latch may have soft error reliability problems. If an effective fuse latch trip point is set too low, the latch may have little margin to read a programmed fuse correctly. Accordingly, there is a need for an improved and accurate antifuse programming scheme.

BRIEF SUMMARY OF THE INVENTION

It is therefore an object of the present invention is to provide an improved antifuse structure and programming method which significantly reduces inconsistent programming resistance values among a plurality of antifuse elements.

Another object of the present invention is to provide an improved antifuse programming scheme which facilitates setting the effective fuse latch trip point of a fuse latch.

Another object of the present invention is to provide an improved antifuse programming/reading scheme, in which a plurality of antifuse elements are sequentially programmed and simultaneously read.

According to the present invention, the foregoing and other objects and advantages are achieved in part by an antifuse structure comprising a first node providing a first voltage, a plurality of antifuse elements, and a plurality of first switches. The plurality of antifuse elements are commonly connected to the first node. The plurality of first switches are sequentially activated during a program mode to individually apply the first voltage to each antifuse element. The antifuse structure may also include a second node to which a second voltage is provided. Each of the plurality of first switches may be coupled between the second node and a corresponding one of the plurality of antifuse elements. The antifuse structure may also include a third node to which a fuse latch is connected. A plurality of second switches may be coupled between the third node and a corresponding one of the plurality antifuse elements. The plurality of second switches may be simultaneously activated during a read mode.

In operation, while the first voltage is commonly applied to each of said plurality of antifuse elements, the plurality of first switches are sequentially activated to individually program each antifuse element during the program mode.

BRIEF DESCRIPTION OF THE SEVERAL VIEWS OF THE DRAWINGS

The foregoing and other objects, aspects and advantages will be better understood from the following detailed description of a preferred embodiment of the invention with reference to the drawings, in which.

DETAILED DESCRIPTION OF THE INVENTION

The present invention is directed to an antifuse programming/reading scheme, in which a programming voltage from antifuse programming voltage source is sequentially applied to each of a plurality of antifuse elements during a programming mode. This significantly reduces the possibility of inconsistent resistance values among the antifuse elements and facilitates setting an effective fuse latch trip point. Once the plurality of antifuse elements are programmed, all of the antifuse elements are simultaneously connected to a fuse latch to read the resistance value thereof. Therefore, the effective parallel resistance value programmed in an antifuse structure can be significantly reduced.

Previously, it has been observed that, according to the conventional antifuse programming schemes, a plurality of antifuse elements (e.g. fingers) are connected to a programming voltage source in parallel, and a programming voltage is simultaneously applied to all of the antifuse elements. This causes several problems, such as, for example, inconsistent programmed resistance values among the antifuse elements. For example, under an identical condition, one of the antifuse elements may program at a very high program resistance values (e.g., 100 k ohm or more) and another may program at a very low program resistance values (e.g., 50 k ohm or less).

Figure 1:
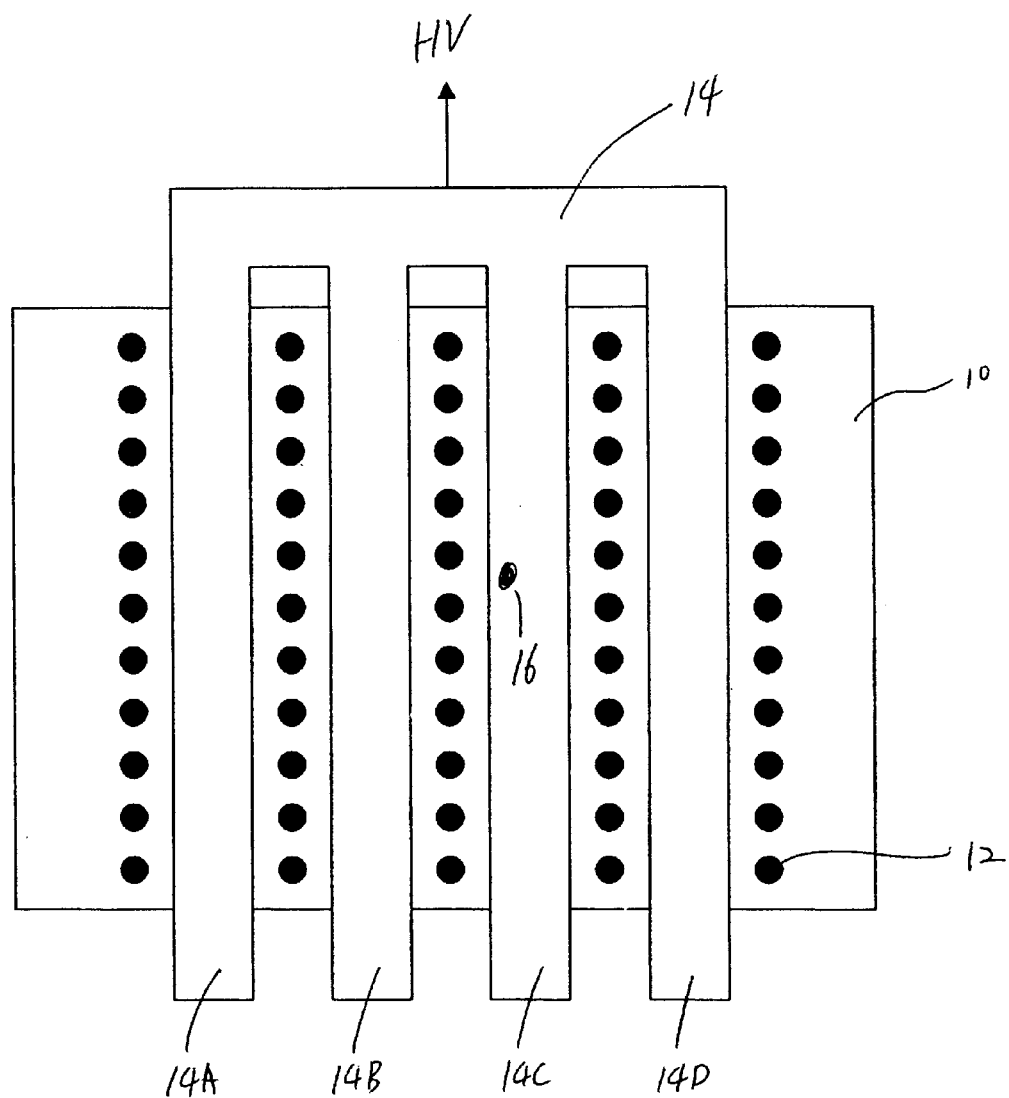
FIG. 1 depicts a conventional fingered antifuse structure for parallel programming formed on a semiconductor substrate.
Figure 2:
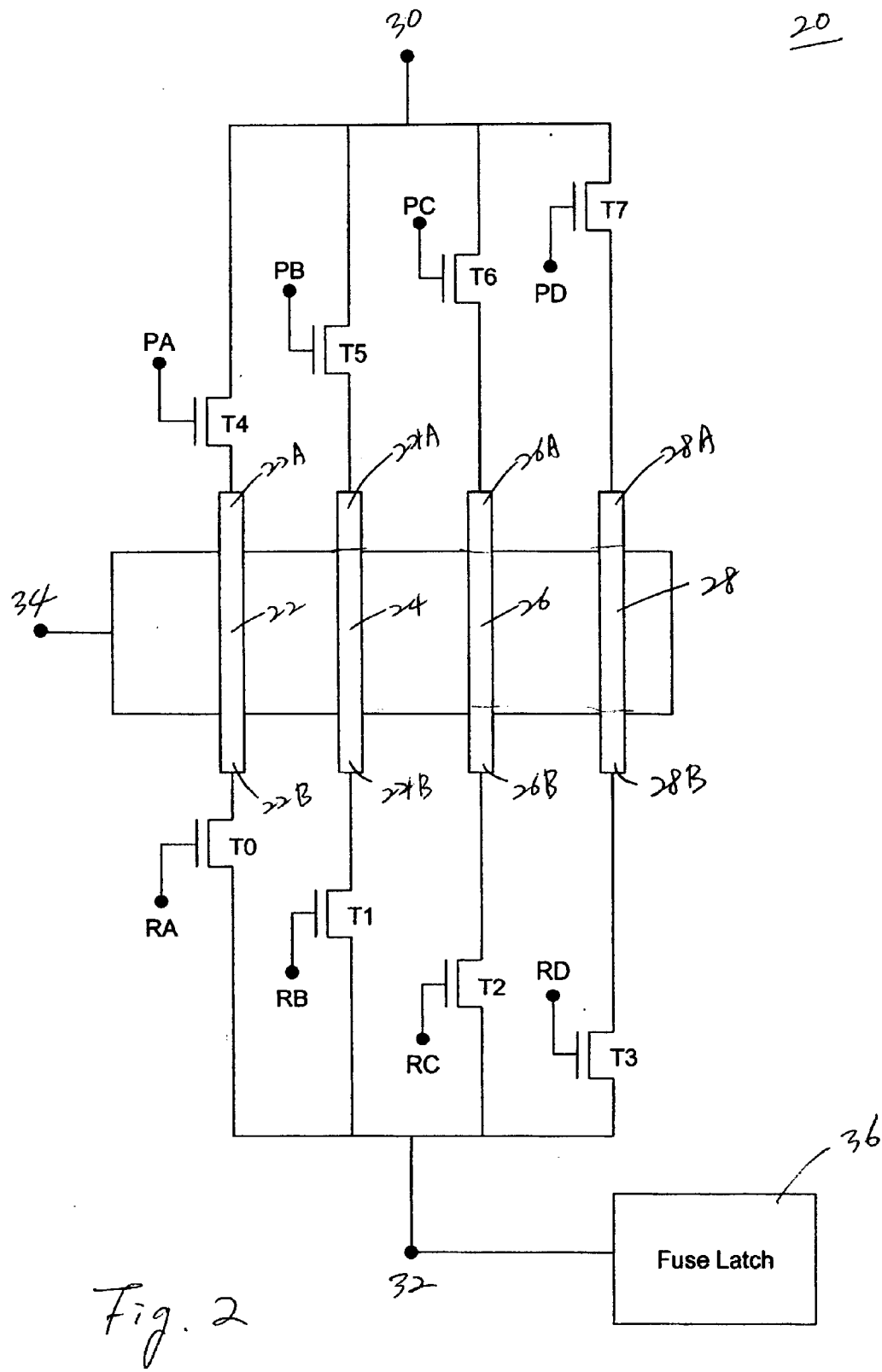
FIG. 2 depicts an antifuse structure for serial programming and parallel reading, in accordance with the present invention.

With this idea in mind, FIG. 2 depicts an antifuse structure 20 in accordance with the present invention. The antifuse structure 20 is provided with at least two antifuse elements. The example shown uses four antifuse elements 22, 24, 26 and 28, for illustration purposes. The number of antifuse elements can be varied depending on the application. Each antifuse element has two ends, for example, the antifuse element 22 has first and second ends 22A and 22B. The antifuse elements 22, 24, 26 and 28 are commonly connected to a first node (e.g., program voltage node) 34. The common node 34 is a substrate which forms the back plate of each the antifuse elements, i.e., a common back plate.

A plurality of first switches T4, T5, T6 and T7 are provided between a second node 30 (e.g., ground node) and the first ends 22A, 24A, 26A and 28A of the antifuse elements 22, 24, 26 and 28, respectively. For example, the first switch T4 is coupled between the second node 30 and the first end 22A of its corresponding antifuse element 22. A plurality of second switches T0, T1, T2 and T3 are provided between a third node (e.g., read node) 32 and the second ends 22B, 24B, 26B and 28B of the antifuse elements 22, 24, 26 and 28, respectively. For example, the second switch T0 is coupled between the third node 32 and the second end 22B of its corresponding antifuse element 22. In an embodiment, as shown in FIG. 2, the first and second switches T0–T7 are transistors, e.g. MOS transistors. The control electrodes (e.g. gate electrodes) of the first switches T4–T7 are connected to control signal nodes PA, PB, PC and PD, respectively, and the control electrodes of the second switches T0–T3 are connected to control signal nodes control signal nodes RA, RB, RC and RD.

The first node 34 is commonly connected to the plurality of antifuse elements 22, 24, 26 and 28, and provides various voltages to the antifuse elements 22, 24, 26 and 28 depending on the operational modes of the antifuse structure 20 (e.g. program mode, read mode). For example, the first node 34 supplies an antifuse programming voltage (e.g., about 6–8 V) during the program mode or a voltage different from the antifuse programming voltage (e.g. typically ground voltage) during the read mode. The second node 30 is connected to a voltage source which generates a voltage different from the antifuse programming voltage, i.e., a voltage lower than the antifuse programming voltage (e.g., typically ground voltage). The third node 32 is connected to a fuse latch 36 for sensing the programmed resistance value of the antifuse structure 20.

Figure 3:
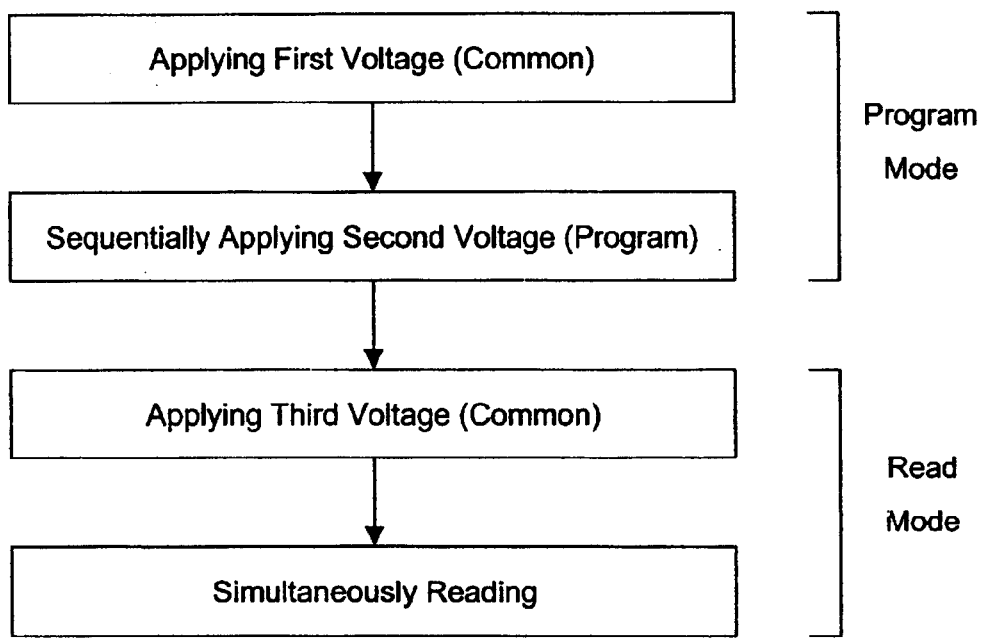
FIG. 3 depicts a process flow chart for serial programming and parallel reading, in accordance with the present invention.

FIG. 3 depicts a process flow chart for serial programming and parallel reading in accordance with the present invention. As previously mentioned, each of the antifuse elements 22, 24, 26 and 28 is individually programmed during the program mode. The first node 34 supplies the first voltage (e.g., typically approximately 6 to 10 V). The second node 30 supplies the second voltage which is substantially lower (e.g., typically approximately 0 V) than the antifuse programming voltage to obtain a potential difference for programming each antifuse element. The potential difference between the first voltage and the second voltage can be optimized for specific fuse structures and technologies. Also, the potential difference can be obtained by switching the voltages provided to the first and second nodes 34 and 30. Thus, the method of obtaining the potential difference for antifuse programming is not limited to the embodiment disclosed herein.

Once the potential difference is obtained between the first and second nodes 34 and 30, the switches T4–T7 are sequentially activated and the second node 30 is individually connected to each antifuse element one by one. The antifuse program voltage is applied to only one of the antifuse elements while other antifuse elements are disconnected from the second node 30. This is done by control signal nodes PA, PB, PC and PD which turn on/off their respective switches T4–T7. For example, the control signal node PA activates the transistor P4 to establish electrical connection between the second node 30 and the antifuse element 22. The antifuse programming voltage from the first node 34 is applied to the antifuse element 22 and the antifuse programming voltage applied thereto programs the antifuse element 22 at a desired resistance value (typically, 1 k to 100 k ohm).

Once the programming on the antifuse element 22 is completed, the transistor T4 is deactivated by the control signal from the control signal node PA to disconnect the antifuse element 22 from the second node 30. Subsequently, the control signal node PB activates the transistor T5 to establish electrical connection between the second node 30 and the antifuse element 24. The antifuse programming voltage is applied to the antifuse element 24. Once all of the antifuse elements are sequentially programmed, the transistors T4–T7 are deactivated and the programmed antifuse elements are disconnected from the second node 30.

Thus, according to the present invention, each antifuse element is individually connected to the antifuse program voltage. If all of the antifuse elements 22, 24, 26 and 28 were programmed simultaneously, a filament would be formed only in the weakest antifuse element and shunt the programming voltage and current away from other potential filament sites. As compared to this conventional antifuse programming scheme, according to the present invention, each antifuse element is independently programmed to allow a filament to be formed in each antifuse element. Since the resistance value of the antifuse structure 20 is the resistance values of the four antifuse elements in parallel, the resistance value of the antifuse structure 20 is reduced at least by a factor of four. Also, the independent antifuse element programming significantly reduces the probability that all of the antifuse elements are programmed to a very high resistance. Particularly, given that a 90% successful antifuse programming rate is unacceptable, the present invention may provide a 99% successful antifuse programming rate, which far exceeds the probability of the successful antifuse programming as compared to conventional parallel antifuse programming.

In the read mode, all of the first switches T4, T5, T6 and T7 are deactivated. The first node 34 provides a third voltage (e.g., typically approximately 0 V) to the antifuse elements 22, 24, 26 and 28, and all of the second switches T0–T3 are simultaneously activated by the control signals from the control nodes RA, RB, RC and RD in order to simultaneously connect the antifuse elements 22, 24, 26 and 28 to the third node 32.

The third voltage provided by the first node 34 is controlled to establish the potential differences between the first node 34 and the third node 32 during the read mode. The third node 32 is connected to a fuse latch 36 which reads the programmed resistance values of the antifuse elements 22, 24, 26 and 28 in parallel. The fuse resistance of the antifuse structure is the resistance of the four fuse elements 22, 24, 26 and 28 in parallel. Thus, the fuse resistance of the antifuse structure 20 is reduced at least by a factor of four (i.e., the number of fuse elements in an antifuse structure), which enables to easily set the effective fuse latch trip point of the fuse latch 36.

The fuse latch 36 is a circuit with an initialized first state. When coupled to an antifuse element with a high resistance value, the fuse latch 36 retains its initialized first state. If, however, the antifuse element has been programmed, the first initial state is altered to a second state. This is done by draining off current from a precharged latch node (i.e., the third node 32) though the antifuse element to the first node 34. Therefore, the fuse latch 36 transforms the resistance value of the antifuse structure 20 into a binary signal output of "1" (high antifuse resistance) or "0" (low antifuse resistance).

Accordingly, the present invention enables serial programming of an antifuse structure which significantly increases the successful antifuse programming rate. Thus, the present invention provides an improved and efficient antifuse programming scheme. Also, the parallel reading scheme of the present invention reduces the fuse resistance of the antifuse structure and facilitates more reliable fuse read with simple circuitry.

The present invention is applicable to the production of various types of semiconductor devices, particularly applicable to high-density semiconductor devices. However, it should be recognized that the present invention can be practiced without resorting to the details specifically set forth. In other instances, well known processing structures have not been described in detail, in order not to unnecessarily obscure the present invention.

Only the preferred embodiment of the present invention and a few examples of its versatility are shown and described in the present disclosure. It is to be understood that the present invention is capable of use in various other combinations and environments and is capable of changes or modifications within the scope of the inventive concept as expressed herein.

What is claimed is:

1. An antifuse structure comprising:
   a first node providing a first voltage;
   a plurality of antifuse elements each commonly connected to the first node; and
   a plurality of first switches connecting between the plurality of antifuse elements and a second node, wherein said plurality of first switches are sequentially activated during a program mode to individually apply a potential difference across selected antifuse elements of said plurality of antifuse elements
   a third node; and
   a plurality of second switches, each coupled between said third node and a corresponding one of said plurality of antifuse elements, said plurality of second switches being simultaneously activated during a read mode;
   wherein said second node provides a second voltage different from said first voltage such that the potential difference exists between said first voltage and said second voltage for programming each of said antifuse elements.

2. The antifuse structure of claim 1, wherein said third node is connected to a fuse latch.

3. The antifuse structure of claim 1, wherein said first node provides a third voltage to said plurality of antifuse elements during said read mode.

4. The antifuse structure of claim 3, wherein said plurality of first switches are deactivated during said read mode, and said plurality of second switches are deactivated during said program mode.

5. The antifuse structure of claim 1, wherein said plurality of first switches are transistors, each coupled between said second node and said corresponding antifuse element and having a control electrode connected to a corresponding control signal node.

6. The antifuse structure of claim 1, wherein said plurality of second switches are transistors, each coupled between said third node and said corresponding antifuse element and having a control electrode connected to a corresponding control signal node.

7. The antifuse structure of claim 1, wherein each first switch is coupled between said second node and a first end of said corresponding antifuse element, and each second switch is coupled between said third node and a second end of said corresponding antifuse element.

8. The antifuse structure of claim 1, wherein the potential difference is one of a first potential difference and a second potential difference such that the first potential difference is used in response to programming a first data type in said each of said antifuse elements and the second potential difference is used to program a second data type in said each of plurality of antifuse elements.

9. The antifuse structure of claim 1, further comprising a structure permitting parallel reading of said plurality of antifuse elements.

10. The antifuse structure of claim 1, wherein the first switches are individually activated during the program mode to individually apply the potential difference across the selected antifuse elements of said plurality of antifuse elements.

11. A method for programming an antifuse structure, said antifuse structure comprising a plurality of antifuse elements, said method comprising the steps of:
   commonly applying a first voltage to each of said plurality of antifuse elements; and
   sequentially applying a second voltage different from said first voltage to each of said plurality of antifuse elements for individually programming each antifuse element,
   said antifuse structure comprising first and second nodes providing said first and second voltages respectively, during a program mode, wherein said step of sequentially applying said second voltage comprises the step of sequentially activating a plurality of first switches, each coupled between said second node providing said second voltage and a corresponding one of said plurality of antifuse elements;
   reading said plurality of programmed antifuse elements comprising the steps of:

commonly applying a third voltage to each of said plurality of antifuse elements, said third voltage being different from said first voltage; and simultaneously connecting said plurality of antifuse elements to a third node during a read mode, wherein the step of simultaneously connecting said plurality of antifuse elements comprises the step of simultaneously activating a plurality of second switches during said read mode, each second switch coupled between said third node and a corresponding one of said plurality of antifuse elements.

12. The method of claim 11, wherein said third node is connected to a fuse latch.

13. The method of claim 11, wherein said first node provides said first voltage during said program mode and said third voltage during said read mode.

14. The method of claim 13, wherein said plurality of first and second switches are transistors.

15. The method of claim 11, wherein said first voltage is between approximately 6 V and approximately 10 V.

16. The method of claim 15, wherein said second voltage is approximately 0 V.

17. The method of claim 16, wherein said third voltage is approximately 0 V.

* * * * *